United States Patent [19]

El-Hamamsy

[11] Patent Number: 5,463,285
[45] Date of Patent: Oct. 31, 1995

[54] VARIABLE CAPACITOR WITH VERY FINE RESOLUTION

[75] Inventor: Sayed-Amr El-Hamamsy, Schenectady, N.Y.

[73] Assignee: General Electric Company, Schenectady, N.Y.

[21] Appl. No.: 209,290

[22] Filed: Mar. 14, 1994

[51] Int. Cl.$^6$ .................................. H05B 41/16
[52] U.S. Cl. ............. 315/248; 315/209 R; 315/240; 315/DIG. 4; 315/307
[58] Field of Search ............... 315/248, 209 R, 315/290, 240, DIG. 4, 307

[56] References Cited

U.S. PATENT DOCUMENTS

| | | | |
|---|---|---|---|
| 3,515,938 | 6/1970 | Morse | 315/240 |
| 4,070,603 | 1/1978 | Regan et al. | |
| 4,447,765 | 5/1984 | Cote | 315/240 |
| 4,525,651 | 6/1985 | Ahlgren | 315/240 |
| 4,629,887 | 12/1986 | Bernier | |
| 4,730,147 | 3/1988 | Kroening | |
| 4,783,615 | 11/1988 | Dakin | |
| 4,810,938 | 3/1989 | Johnson et al. | |
| 4,812,702 | 3/1989 | Anderson | |
| 4,972,120 | 11/1990 | Witting | |
| 4,994,718 | 2/1991 | Gordin | 315/240 |
| 5,023,566 | 6/1991 | El-Hamamsy et al. | |
| 5,039,903 | 8/1991 | Farrall | |
| 5,047,692 | 9/1991 | Borowiec et al. | |
| 5,118,997 | 6/1992 | El-Hamamsy | |

Primary Examiner— Robert J. Pascal
Assistant Examiner—Reginald A. Ratliff
Attorney, Agent, or Firm—Jill M. Breedlove; Marvin Snyder

[57] ABSTRACT

The resolution $\Delta C$ of a binary capacitance ladder having a plurality of N branches is precisely determined by appropriately selecting the value of a fixed capacitor in each branch relative to the parasitic capacitance of a corresponding series-connected switch. The capacitance of each respective branch varies by $2^{n-1}\Delta C$, where n is the number of the branch, adjacent branches being numbered sequentially. The total capacitance is variable between $C_{Total}$ and $C_{Total}-(2^N-1)\Delta C$ in steps of $\Delta C$, where $C_{Total}$ is the sum of the capacitances in the ladder with all switches closed, and $C_{Total}-(2^N-1)\Delta C$ is the capacitance of the ladder with all switches open. For any particular branch of the ladder, the switch capacitance may be further controlled by adding a fixed capacitance in parallel with the respective switch. Such a variable capacitance is useful as a tuning capacitor in an electrodeless HID lamp ballast.

7 Claims, 4 Drawing Sheets

VARIABLE CAPACITOR WITH VERY FINE RESOLUTION

FIELD OF THE INVENTION

The present invention relates generally to variable capacitors and, more particularly, to a binary capacitance ladder for use as a variable capacitor with very fine resolution. Such a variable capacitor is useful, for example, in an electrodeless high intensity discharge lamp ballast.

BACKGROUND OF THE INVENTION

Variable capacitors may be used for automatic circuit tuning. In low power circuits, for example, a varactor, which is a semiconductor device having a junction capacitance that varies with bias voltage, is often used for automatic tuning. For high power, high cost applications, mechanical actuators, e.g., stepper motors, with feedback may be used to control capacitance. Unfortunately, neither of these approaches is suitable for electrodeless high intensity discharge (HID) lamp ballasts, which are typically high power, low cost applications.

In an electrodeless HID lamp, an arc discharge is generated by establishing a solenoidal electric field in a gas contained within an arc tube. The solenoidal electric field is created by the time-varying magnetic field of an excitation coil which is disposed about the arc tube. To maximize efficiency of an HID lamp, the degree of coil coupling between the magnetic field and the arc discharge must be maximized. Since the degree of coupling increases with frequency, electronic ballasts used to drive HID lamps operate at high frequencies in the range from 0.1 to 30 MHz, exemplary operating frequencies being 13.56 and 6.78 MHz. These exemplary frequencies are within the industrial, scientific, and medical (ISM) band of the electromagnetic spectrum in which moderate amounts of electromagnetic radiation are permissible; and such radiation is generally emitted by an electrodeless HID lamp system.

Operation of an HID lamp ballast at the series resonant frequency of the load circuit maximizes power output. However, operation at a frequency slightly higher than the series resonant frequency of the load circuit maximizes ballast efficiency. Hence, for maximum efficiency, operation is slightly "off" resonance, and a specific ballast load resistance and phase angle are required. To this end, the impedance of the ballast load, including that of the arc discharge as reflected into the ballast load, must be matched to the required ballast load resistance and phase angle. As described in commonly assigned, U.S. Pat. No. 5,047,692 of J. C. Borowiec and S-A El-Hamamsy, issued Sep. 10, 1991, which is incorporated by reference herein, a capacitance connected in parallel with the excitation coil is needed to match the resistive component of the ballast load impedance, and a capacitance connected in series with the excitation coil is needed to obtain the proper phase angle. However, the output impedance of the ballast, and thus the matching conditions, for running and starting the lamp are different. In addition, the circuit is very sensitive to component variations because its quality factor (Q), when the lamp is running, is very high, e.g., 20–40.

Accordingly, it is desirable to provide an automatically variable capacitor useful for tuning an electrodeless high intensity discharge lamp ballast as the output impedance thereof changes between starting and running conditions. In addition, it is desirable that such a variable capacitor be automatically tunable for matching the ballast impedance as it changes due to impedance variations in circuit components.

SUMMARY OF THE INVENTION

A variable capacitor having a predetermined resolution $\Delta C$ comprises a binary capacitance ladder with a plurality N of branches, each branch comprising a fixed capacitor and a switch connected in series. By appropriately selecting the value of the fixed capacitor in each branch relative to the parasitic capacitance of the corresponding series-connected switch, the resolution $\Delta C$ of the binary capacitance ladder is determined precisely. The capacitance of each respective branch varies by $2^{n-1}\Delta C$, where n is the number of the branch, adjacent branches being numbered sequentially. The total capacitance is variable between $C_{Total}$ and $C_{Total}-(2^N-1)\Delta C$ in steps of $\Delta C$, where: $C_{Total}$ is the sum of the capacitances in the ladder with all switches closed; $C_{Total}-(2^N-1)\Delta C$ is the capacitance of the ladder with all switches open; and N is the total number of branches. For any particular branch of the ladder, the switch capacitance may be further controlled by adding a fixed capacitance in parallel with the respective switch.

A variable capacitance in accordance with the present invention is useful as a tuning capacitor in an electrodeless HID lamp ballast.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
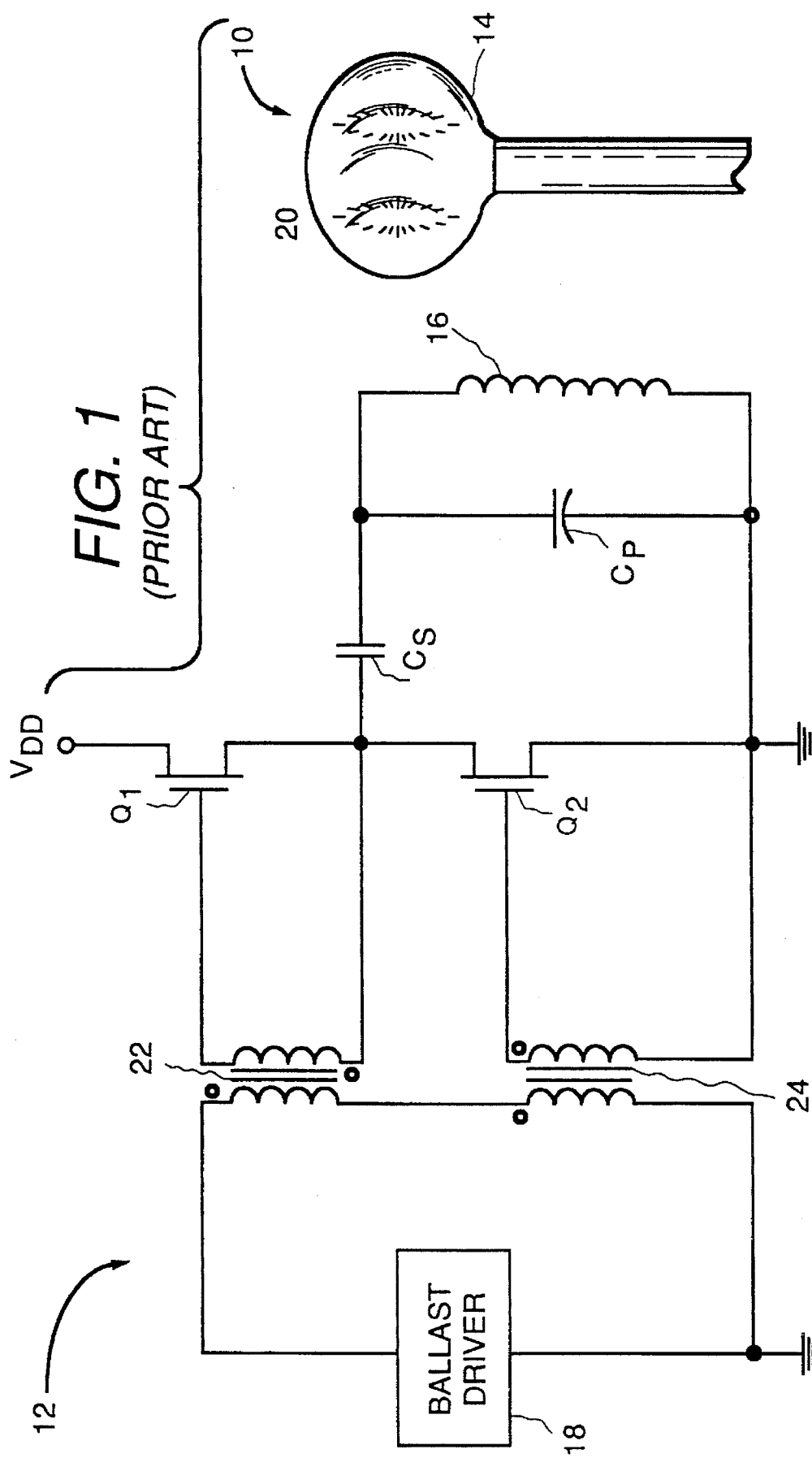
FIG. 1 schematically illustrates an electrodeless HID lamp system including a Class-D ballast.

FIG. 1 is a schematic diagram of an electrodeless HID lamp 10 and associated ballast 12, such as those described in U.S. Pat. No. 5,047,692 of J. C. Borowiec and S-A El-Hamamsy, cited hereinabove. The HID lamp includes an arc tube 14 formed of a high temperature glass, such as fused quartz, or an optically transparent ceramic, such as polycrystalline alumina. By way of example, arc tube 14 is shown as having a substantially ellipsoid shape. However, arc tubes of other shapes may be desirable, depending upon the application. For example, arc tube 14 may be spherical or may have the shape of a short cylinder, or "pillbox", having rounded edges, if desired.

Arc tube 14 contains a fill in which a solenoidal arc discharge is excited during lamp operation. A suitable fill, described in commonly assigned U.S. Pat. No. 4,810,938 of P. D. Johnson, J. T. Dakin and J. M. Anderson, issued on Mar. 7, 1989, comprises a sodium halide, a cerium halide and xenon combined in weight proportions to generate visible radiation exhibiting high efficacy and good color rendering capability at white color temperatures. For example, such a fill according to the Johnson et al. patent may comprise sodium iodide and cerium chloride, in equal weight proportions, in combination with xenon at a partial pressure of about 500 torr. The Johnson et al. patent is hereby incorporated by reference. Another suitable fill, described in commonly assigned U.S. Pat. No. 4,972,120 of H. L. Witting, issued Nov. 20, 1990 and incorporated by reference herein, comprises a combination of a lanthanum halide, a sodium halide, a cerium halide and xenon or krypton as a buffer gas.

Electrical power is applied to the HID lamp by an excitation coil 16 disposed about arc tube 14 which is driven by an RF signal via a ballast driver 18 and ballast 12. (For clarity of illustration, coil 16 is not shown in its operational position about arc tube 14.) A suitable excitation coil 16 may comprise, for example, a two-turn coil having a configuration such as that described in commonly assigned U.S. Pat. No. 5,039,903 of G. A. Farrall, issued Aug. 13, 1991 and incorporated by reference herein. Such a coil configuration results in very high efficiency and causes only minimal blockage of light from the lamp. The overall shape of the excitation coil of the Farrall patent is generally that of a surface formed by rotating a bilaterally symmetrical trapezoid about a coil center line situated in the same plane as the trapezoid, but which line does not intersect the trapezoid. However, other suitable coil configurations may be used with the starting aid of the present invention, such as that described in commonly assigned U.S. Pat. No. 4,812,702 of J. M. Anderson, issued Mar. 14, 1989, which patent is hereby incorporated by reference. In particular, the Anderson patent describes a coil having six turns which are arranged to have a substantially V-shaped cross section on each side of a coil center line. Still another suitable excitation coil may be of solenoidal shape, for example.

In operation, RF current in coil 16 results in a time-varying magnetic field which produces within arc tube 14 an electric field that completely closes upon itself. Current flows through the fill within arc tube 14 as a result of this solenoidal electric field, producing a toroidal arc discharge 20 in arc tube 14. The operation of an exemplary electrodeless HID lamp is described in commonly assigned Dakin U.S. Pat. No. 4,783,615, issued on Nov. 8, 1988, which patent is hereby incorporated by reference.

As illustrated in FIG. 1, HID lamp ballast 12 comprises a Class-D power amplifier including two switching devices $Q_1$ and $Q_2$ connected in series with a dc power supply $V_{DD}$ in a half-bridge configuration. Switching devices $Q_1$ and $Q_2$ are illustrated as MOSFET's, but other types of switching devices having capacitive gates may be used, such as insulated gate bipolar transistors (IGBT's) or MOS-controlled thyristors (MCT's). Switching devices $Q_1$ and $Q_2$ are coupled to ballast driver 18 via input isolation transformers 22 and 24, respectively. In operation, the switching devices are driven alternately between cutoff and saturation such that one is conducting while the other one is turned off and vice versa. Hence, the Class-D ballast may be conveniently driven by a square wave signal. Alternatively, ballast driver 18 may comprise means for generating two out-of-phase sinusoidal signals, as described in commonly assigned U.S. Pat. No. 5,023,566 of S-A El-Hamamsy and G. Jernakoff, issued Jun. 11, 1991 and incorporated by reference herein.

A resonant load network is connected to the half-bridge at the junction between switching devices $Q_1$ and $Q_2$ and in parallel with switching device $Q_2$. The resonant load network comprises the excitation coil 16 of HID lamp 10 and a tuning capacitor $C_p$ connected in parallel therewith. The parallel combination of capacitor $C_p$ and coil 16 functions as an impedance transformer to reflect the impedance of the arc discharge 20 into the ballast load. A blocking/tuning capacitor $C_s$ is connected in series with the parallel combination of coil 16 and capacitor $C_p$. In particular, capacitor $C_s$ is used both for blocking dc voltage and for resonant circuit tuning.

Capacitors $C_s$ and $C_p$ are chosen to ensure impedance matching for maximum efficiency. That is, these capacitors are chosen to ensure that the ballast load is designed for optimum values of resistance and phase angle. As described in U.S. Pat. No. 5,047,692, cited hereinabove, the excitation coil of the HID lamp acts as the primary of a loosely-coupled transformer, while the arc discharge acts as both a single-turn secondary and secondary load. The impedance of the arc discharge is reflected to the primary, or excitation coil, side of this loosely-coupled transformer. To match the ballast load impedance for maximum efficiency, the parallel capacitor operates with the excitation coil to match the proper resistive load value, and the series capacitor acts with the combination of the excitation coil and parallel capacitance to yield the required phase angle.

Figure 2:
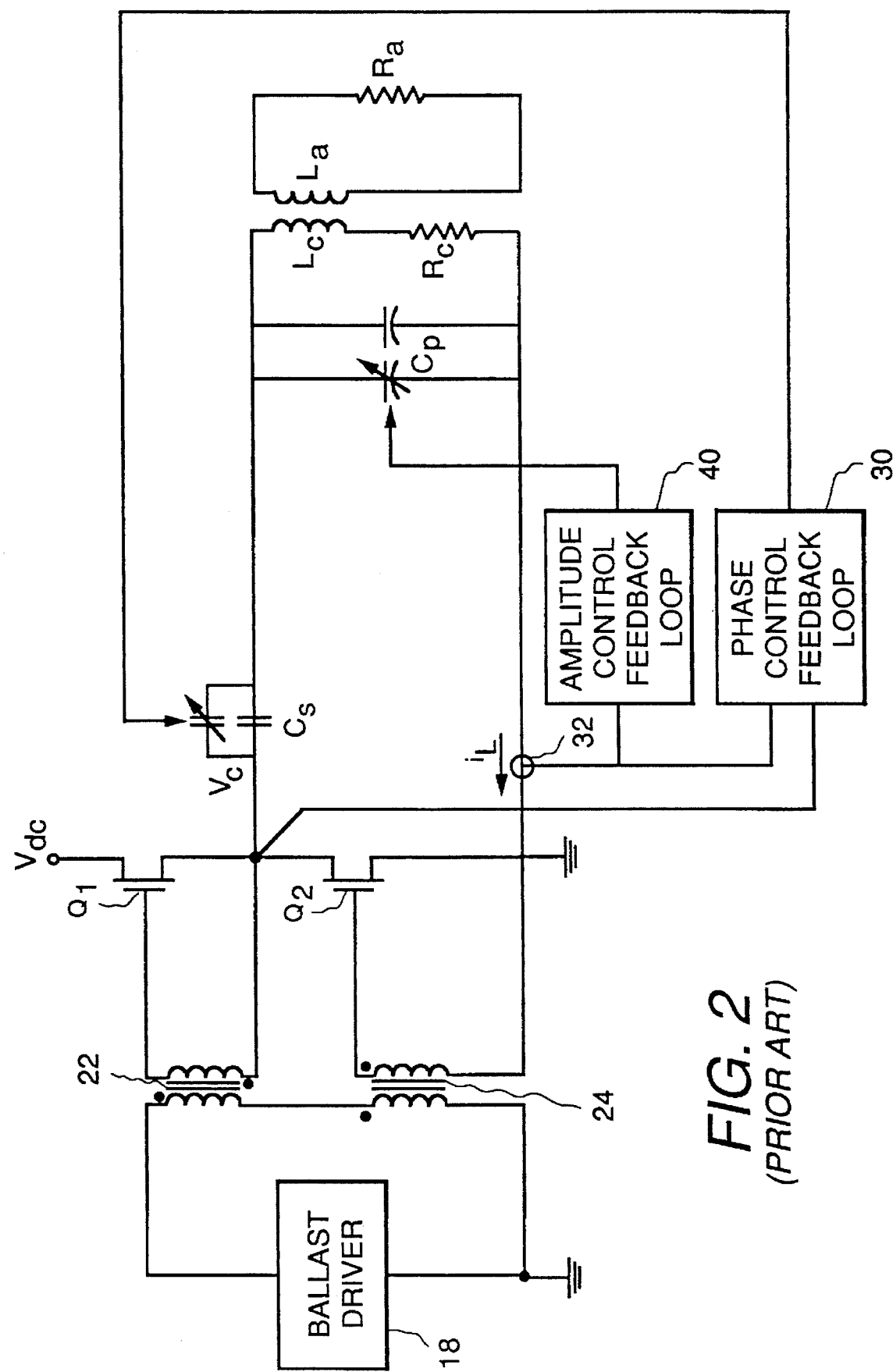
FIG. 2 schematically illustrates a dual feedback control useful for tuning the ballast load impedance of FIG. 1.

Preferably, both tuning capacitors $C_s$ and $C_p$ are variable to provide matching under starting and running conditions as well as for impedance variations in circuit components. FIG. 2 illustrates a dual-feedback control for a Class-D ballast, such as described in commonly assigned U.S. Pat. No. 5,118,997 of S-A El-Hamamsy, issued Jun. 2, 1992 and incorporated by reference herein, useful for controlling the values of capacitances $C_s$ and $C_p$ to match the ballast load impedance under changing conditions. A phase control feedback loop 30 varies the value of series tuning capacitor $C_s$ to provide load phase angle control; and an amplitude control feedback loop 40 varies the value of parallel tuning capacitor $C_p$ to provide load amplitude control. In FIG. 2, $L_c$ represents the inductance and $R_c$ represents the resistance of coil 16; $L_a$ represents the inductance and $R_a$ represents the resistance of the arc discharge; and k is the coupling coefficient between the coil and the arc discharge.

Figure 3:
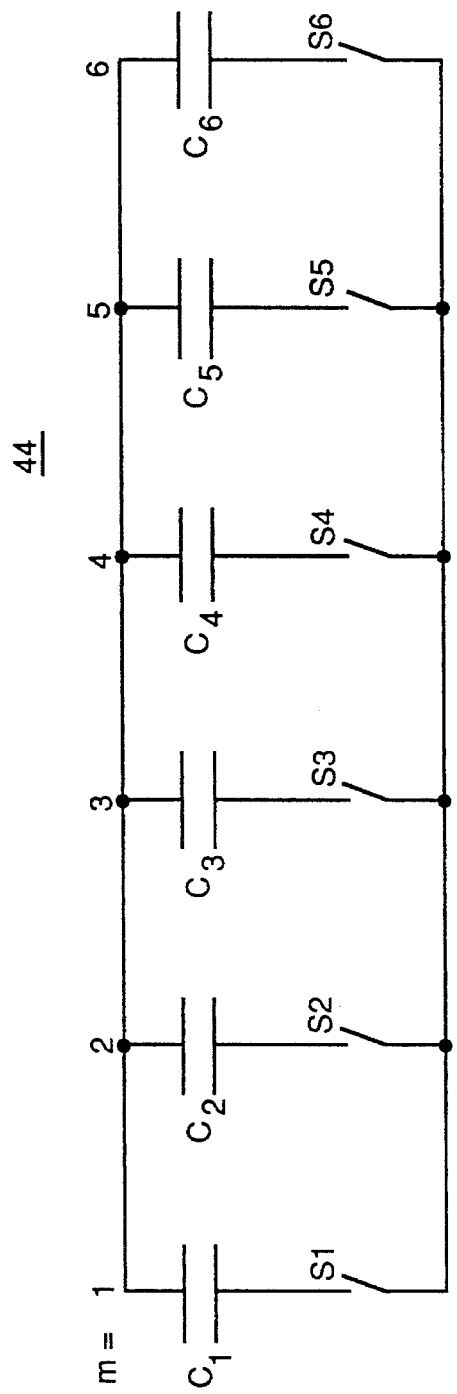
FIG. 3 schematically illustrates a binary capacitance ladder.

FIG. 3 illustrates a binary capacitance ladder 44 including a plurality of branches m, each including a fixed capacitor $C_m$ in series with a switch $S_m$. For the binary capacitance ladder of FIG. 3, m={1, 2, ... } and $C_m = 2^{m-1} \Delta C$, where $\Delta C$ is the resolution of the ladder. For ideal switches, the capacitance of such a ladder is given by the sum of the capacitances $C_m$ in the branches with closed switches $S_m$. In practice, however, every open switch has a parasitic capacitance associated therewith. Therefore, in order for such a binary capacitance ladder to be useful as a variable capacitance, the capacitance of each switch $S_m$ would have to be at least ten times smaller than the capacitance of the fixed capacitor $C_m$ associated therewith. Such a binary capacitance is not practical for an electrodeless HID lamp ballast. In particular, for a typical electrodeless HID lamp ballast, a useful variable capacitor has a resolution of less than 2 pF, which would require a switch capacitance of less than 0.2 pF, a capacitance that is very difficult to achieve at low cost in a switch carrying substantial current.

Figure 4:
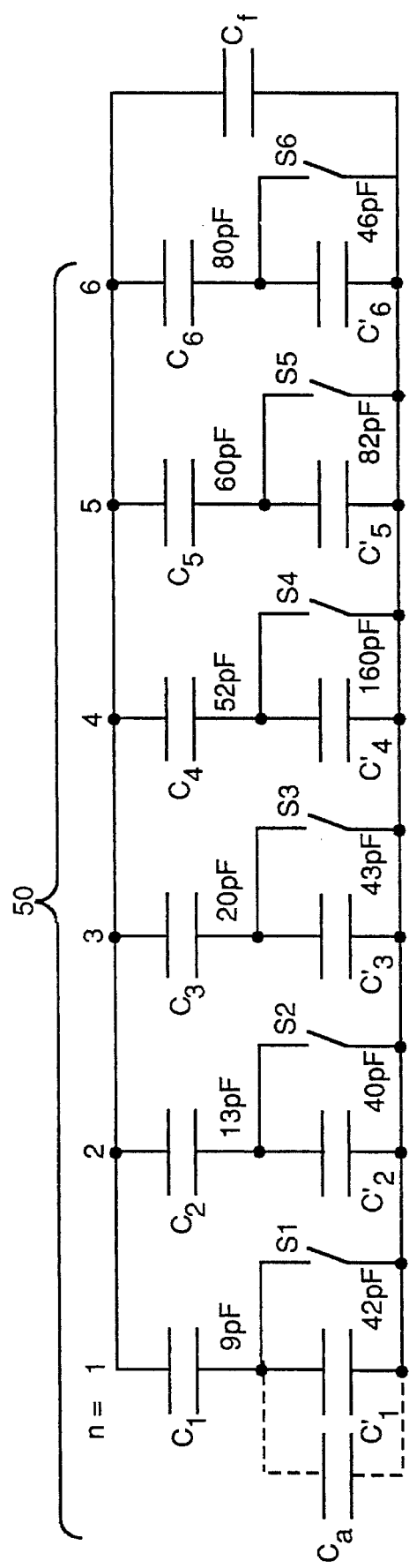
FIG. 4 schematically illustrates a preferred embodiment of a binary capacitance ladder in accordance with the present invention.

FIG. 4 illustrates a variable capacitor comprising a binary capacitance ladder 50 according to the present invention suitable for use as either or both the series tuning capacitor $C_s$ and the parallel tuning capacitor $C_p$ in the HID lamp ballast of FIG. 2. In particular, binary capacitance ladder 50 provides a variable capacitance capable of a very fine predetermined resolution $\Delta C$. Variable capacitance ladder 50 comprises a binary capacitance ladder with a plurality N of branches, each branch comprising a capacitor $C_n$ and a switch $S_n$ connected in series, where n={1, 2, ... N}, where n is the number of the branch, adjacent branches being numbered sequentially. The capacitance $C_{eqn}$ of each respective branch with its corresponding switch $S_n$ closed is $C_n$. The maximum total capacitance $C_{Total}$ of the binary capacitance ladder with all switches $S_n$ closed is:

$$C_{Total}=C_1+C_2+\ldots+C_n.$$

The capacitance $C_{eqn}'$ of each respective branch with its corresponding switch $S_n$ open is given by the expression:

$$C_{eqn}' = \frac{C_n C_n'}{C_n + C_n'},$$

where $C_n'$ represents the parasitic capacitance of the respective open switch. Therefore, the change in capacitance $\Delta C_n$ for each respective branch is given by:

$$\Delta C_n = C_{eqn} - C_{eqn}' = C_n - \frac{C_n C_n'}{C_n + C_n'} = 2^{n-1} \Delta C.$$

The total capacitance of binary capacitance ladder 50 is variable between $C_{Total}$ and $C_{Total}-(2^N-1)\Delta C$ in steps of $\Delta C$, where N is the total number of branches.

The resolution $\Delta C$ of the binary capacitance ladder 50 is the difference in capacitance between fixed capacitor $C_1$ in series with the closed switch $S_1$ and the capacitance of fixed capacitor $C_1$ in series with the parasitic capacitance $C_1'$ of the open switch $S_1$. By appropriately selecting the value of the fixed capacitor in each branch relative to the parasitic capacitance of the corresponding series-connected switch, the resolution $\Delta C$ of the binary capacitance ladder can be determined precisely.

For the exemplary binary capacitance ladder 50 of FIG. 4, N=6, and the given capacitance values of $C_n$ and $C_n'$ give a total capacitance variation $\Delta C_{Total}$ of approximately 100 pF with a resolution $\Delta C$ of approximately 1.6 pF.

A preferred design for a binary capacitance ladder, for use, for example, as a capacitor $C_s$ or $C_p$ in an electrodeless HID lamp ballast such as that of FIGS. 1–2, would employ a total capacitance value $C_{Total}$ within the desired variable capacitance range coupled to a fixed capacitor $C_f$ to achieve the nominal variable capacitance value $C_{nom}$ (of $C_s$ or $C_p$, for example) according to:

$$C_{nom}=C_f+C_{Total}-k\Delta C_{Total}, \text{ where } 0 \leq k \leq 1.$$

For example, for k=½, switch $S_N$ would be closed, and all other switches in the binary capacitance ladder would be open. Such a design would allow for both increases and decreases in capacitance, depending on system requirements.

Figure 5:
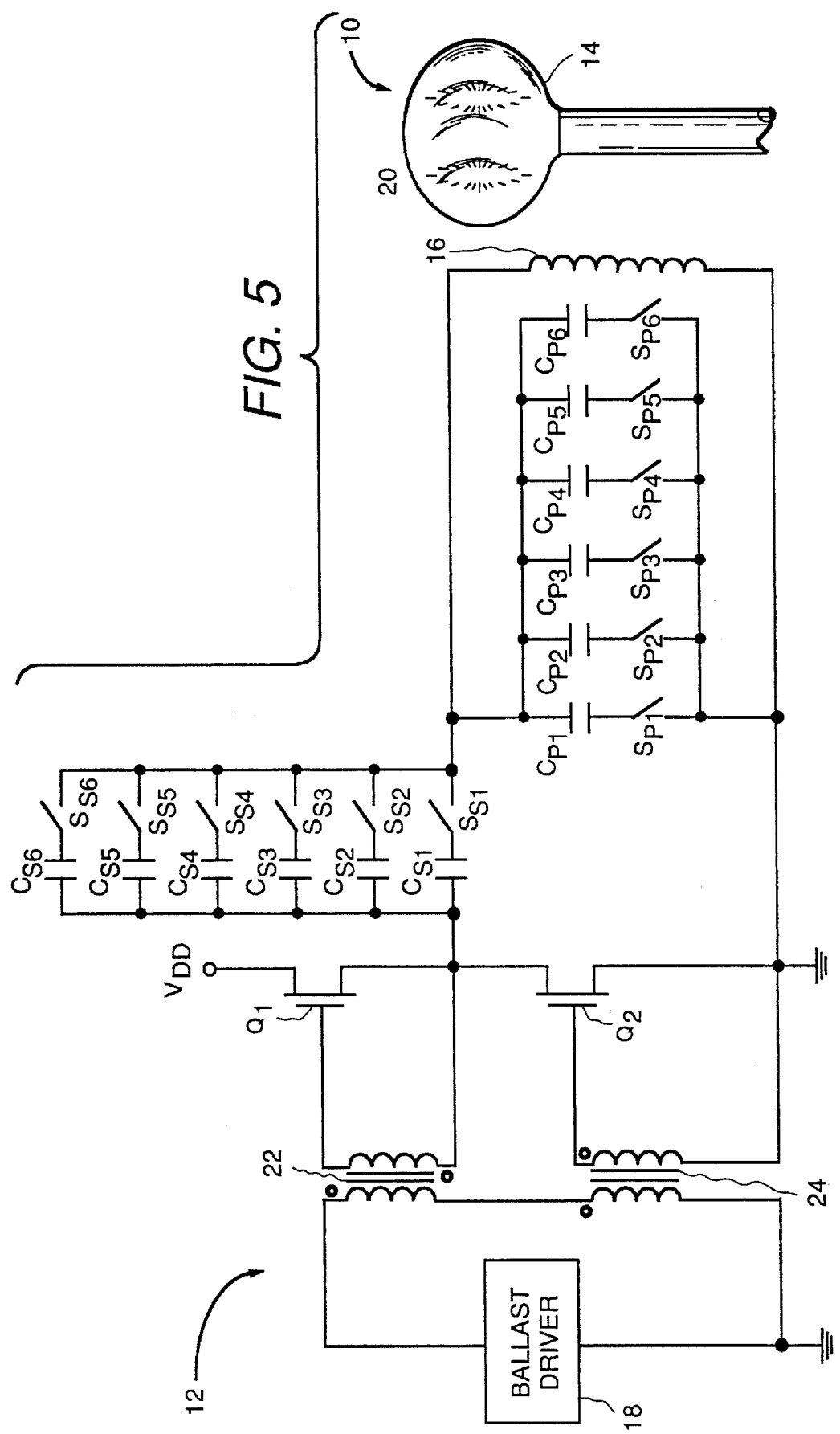
FIG. 5 schematically illustrates the circuit of FIG. 1 incorporating binary capacitance ladders in accordance with the present invention.

FIG. 5 illustrates binary capacitance ladders employed as capacitors $C_s$ and $C_p$ in the ballast circuit of FIG. 1.

For any particular branch of the ladder, the capacitance thereof may be further controlled by adding an additional fixed capacitance in parallel with the respective switch, as shown by way of example in phantom as capacitor $C_a$ in branch 1.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A variable capacitor, comprising:

a binary capacitance ladder comprising a plurality N of parallel connected branches and having a predetermined resolution $\Delta C$, each of said branches comprising a fixed capacitor of capacitance $C_n$ coupled in series with a switch having a parasitic capacitance $C_n'$ when open, adjacent branches being numbered sequentially, n being the number of a respective branch, said binary capacitance ladder having a maximum total capacitance $C_{Total}$ given by:

$$C_{Total}=C_1+C_2+\ldots+C_n,$$

each respective branch having a variation in capacitance $\Delta C_n$ due to opening and closing of the respective switch $S_n$ therein given by:

$$\Delta C_n = C_n - \frac{C_n C_n'}{C_n + C_n'} = 2^{n-1} \Delta C,$$

such that said binary capacitance ladder has a total capacitance variation between values of $C_{Total}$ and $C_{Total}-(2^N-1)\Delta C$ in steps of $\Delta C$, said variable capacitor further comprising an additional fixed capacitor coupled in parallel with at least one said switch, such that the capacitance $C_n$ of said switch includes the capacitance of said additional fixed capacitor.

2. The variable capacitor of claim 1, further comprising a fixed-branch capacitor having a capacitance $C_f$ coupled in parallel with said N parallel connected branches, such that said variable capacitor has a nominal capacitance given by:

$$C_{nom}=C_f+C_{Total}-k\Delta C_{Total}, \text{ where } 0 \leq k \leq 1.$$

3. The variable capacitor of claim 2 wherein k=½.

4. A ballast for an electrodeless high intensity discharge lamp of the type having an excitation coil situated about an arc tube for exciting an arc discharge therein upon application of a radio frequency signal to said excitation coil, said ballast comprising:

at least one switching device;

a ballast driver coupled to said switching device for driving said switching device; and a resonant circuit coupled to said switching device, said resonant circuit comprising said excitation coil and at least one variable capacitor, said variable capacitor comprising a binary capacitance ladder comprising a plurality N of parallel connected branches and having a predetermined resolution $\Delta C$, each of said branches comprising a fixed capacitor of capacitance $C_n$ coupled in series with a switch having a parasitic capacitance $C_n'$ when open, adjacent branches being numbered sequentially, n being the number of a respective branch, said binary capacitance ladder having a maximum total capacitance $C_{Total}$ given by:

$$C_{Total}=C_1+C_2+\ldots+C_n,$$

each respective branch having a variation in capacitance $\Delta C_n$ due to opening and closing of the respective switch $S_n$ therein given by:

$$\Delta C_n = C_n - \frac{C_n C_n'}{C_n + C_n'} = 2^{n-1} \Delta C,$$

such that said binary capacitance ladder has a total capacitance variation between values of $C_{Total}$ and $C_{Total} - (2^N - 1)\Delta C$ in steps of $\Delta C$.

5. The ballast of claim 4, further comprising an additional fixed capacitor coupled in parallel with at least one said switch, such that the capacitance $C_n$ of said switch includes the capacitance of said additional fixed capacitor.

6. The ballast of claim 3, further comprising a fixed branch capacitor having a capacitance $C_f$ coupled in parallel with said N parallel connected branches, such that said variable capacitor has a nominal capacitance given by:

$$C_{nom} = C_f + C_{Total} - k\Delta C_{Total}, \text{ where } 0 \leq k \leq 1.$$

7. The ballast of claim 6 wherein $k = \frac{1}{2}$.

* * * * *